United States Patent [19]

Kim

[11] Patent Number: 4,947,059
[45] Date of Patent: Aug. 7, 1990

[54] METHOD OF DIVIDING AN INPUT-OUTPUT LINE BY DECODING

[75] Inventor: Chang-Hyun Kim, Seoul, Rep. of Korea

[73] Assignee: Samsung Electronics Co. Ltd., Suwon, Rep. of Korea

[21] Appl. No.: 305,278

[22] Filed: Feb. 1, 1989

[30] Foreign Application Priority Data

May 19, 1988 [KR] Rep. of Korea ............... 88-5596[U]

[51] Int. Cl.$^5$ ........................................... H03K 19/096
[52] U.S. Cl. .................................... 307/449; 307/453; 307/481; 307/530; 365/230.06
[58] Field of Search ..................... 307/448–449, 307/451–453, 463, 481, 350, 530; 365/205, 230.02, 230.06, 231

[56] References Cited

U.S. PATENT DOCUMENTS

| | | | |
|---|---|---|---|
| 4,200,917 | 4/1980 | Moench | 307/449 X |
| 4,618,784 | 10/1986 | Chappell et al. | 307/449 |
| 4,701,644 | 10/1987 | Campiare | 365/205 X |
| 4,725,742 | 2/1988 | Tachimori et al. | 365/231 X |
| 4,788,457 | 11/1988 | Mashiko et al. | 307/449 |
| 4,803,386 | 2/1989 | Kraus et al. | 307/530 |
| 4,851,716 | 7/1989 | Needles et al. | 307/449 |

*Primary Examiner*—David Hudspeth
*Attorney, Agent, or Firm*—Ladas & Parry

[57] ABSTRACT

There is provided apparatus for dividing an input/output line coupled to a sense amplifier which is driven by the status of a bit line pair, the apparatus comprising a sub input/output line connected to the bit line pair through corresponding first MOS transistors. A main input/output line is connected to output nodes of the sub input/output line through corresponding second MOS transistors. The status of the sub input/output line and the main input/output line are changed in response to first and second decoding signals applied to the first and second transistors, respectively, the first decoding signal arriving prior to the second decoding signal.

3 Claims, 1 Drawing Sheet

METHOD OF DIVIDING AN INPUT-OUTPUT LINE BY DECODING

BACKGROUND OF THE INVENTION

This invention relates to apparatus for dividing the input/output line of a dynamic RAM by means of a decoding arrangement.

Presently, an input/output line is connected through a switching transistor to a sense amplifier for an input/output of a signal. With the increase of the degree of circuit integration, the length of the I/O line becomes longer and the number of gated switching transistors becomes larger. Consequently, increased parasitic capacitances, due to the increment of circuit density, increases the signal propagation delay time.

Therefore, it is required that the loading of the I/O line be decreased to reduce the propagation delay time between a sense amplifier and the I/O line in accordance with the increase of the degree of circuit integration.

SUMMARY OF THE INVENTION

It is an object of the present invention to provide an apparatus for dividing an input/output line by means of a decoding arrangement for reducing the signal propagation delay time in spite of the increase of circuit integration.

The object of the invention is realized by dividing the input/output line into two sections: one is a sub-I/O line and the other is a main-I/O line.

DETAILED DESCRIPTION OF A SPECIFIC EMBODIMENT

The invention will now be described in detail with reference to the attached drawings.

Figure 1:
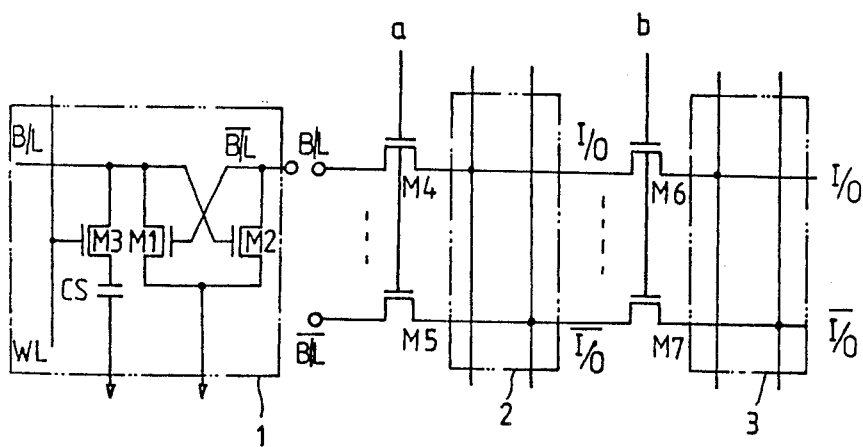
FIG. 1 is a circuit diagram of the present invention.

Referring to FIG. 1, there is illustrated a memory cell composed of an MOS transistor $M_3$ and a condenser CS, and a sense amplifier 1 comprising transistors $M_1$, $M_2$ which are driven in accordance with the status of a pair of bit lines, B/L and $\overline{B}/$. The bit line pair (B/L and $\overline{B}/$) is connected to a sub-I/O line 2 via MOS transistors $M_4$, $M_5$, and the output nodes of the sub-I/O line are connected to the main-I/O line 3 via transistors $M_6$, $M_7$.

As shown in FIG. 1, the sub-I/O line 2 and the main-I/O line 3 each comprises, in this embodiment of the invention, two conductive lines on which complementary signals, corresponding to the signals on the bit lines B/L and $\overline{B}/$, are conducted.

Between the MOS transistors $M_4$, $M_5$, $M_6$, $M_7$, at the increment of the I/O lines, there is a relationship with which the MOS transistors are arranged in parallel with one other.

Figure 2:
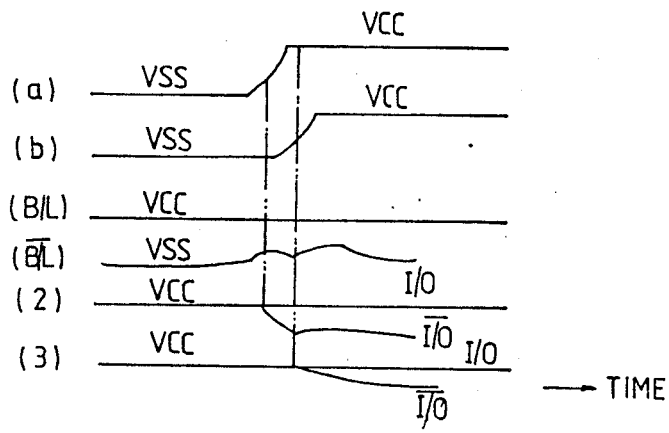
FIG. 2 is a graphic representation showing the transfer of signals within the circuit.

Referring to FIG. 2, there is represented the signal propagation in accordance with the present invention.

When the input/output lines 2 and 3 are precharged to a supply voltage $V_{CC}$ at the time of reading or storing information from or into a memory cell via the sense amplifier 1, as shown in FIG. 2, the status of B/L and $\overline{B}/$ are changed in accordance with decoding signals a and b. Therefore, by the decoding signal a, the status of the sub-I/O line 2 is changed, and by the decoding signal b, the status of the main-I/O line 3 is changed so that information on the B/L and $\overline{B}/$ lines is transferred to the I/O lines.

That is, by the decoding signal a, the MOS transistors $M_4$, $M_5$ are driven to transfer the signals on B/L and $\overline{B}/$ to the sub-I/O line 2. At this instant, the decoding signal a is provided earlier than the decoding signal b.

Therefore, information selected by an address signal is transferred to the main-I/O line 3 via the sub-I/O line 2.

With the sub-I/O line 2 transferring the information, the selected information can be propagated in a shorter time to the main I/O line. The loading components of the input/output lines are composed of a capacitance (50%) due to the Miller effect, junction capacitance (20%) and the parasitic capacitance (30%) between electrodes. The Miller capacitance from the input/output stage is divided into two portions, one is the capacitance loaded on the sub-I/O line and the other is that loaded on the main-I/O line.

Such relationships will now be described quantitatively. The capacitance in the I/O line of a conventional dynamic RAM is $C_J:C_M:C_P=20\%:50\%:30\%$, and the total ratio is 100%, where $C_J$ is junction capacitance, $C_M$ is Miller capacitance, and $C_P$ is parasitic capacitance. Assume that the number of I/O lines increases two times over that in the conventional circuit configuration, the total capacitance is $C_J + C_M' + C_P = (20/2)\% + (50/2)\% + 30\%$, and the sum is 65%, where $C_M'$ is the Miller effect capacitance of the circuit with the increased number of I/O lines.

We observe that the capacitance on the I/O line is reduced, hence the speed of signal propagation is improved. In a circuit according to the present invention, in which 4 sub-I/O lines 2 are used, the total capacitance is $C_J + C_M' + C_{P'} + C_P = (20/4)\% + (50/4)\% + (30/4)\% + 30\%$, and the sum is 55%, where $C_{P'}$ = the effective capacitance of the sub-I/O lines and $C_P$ is the effective capacitance of the main-I/O line.

Therefore, for the circuits to which the present invention is applied, the signal propagation delay time can be reduced by 45%.

As described above, the I/O line divided into a sub-I/O line and a main-I/O line can reduce total capacitance, and much information can be transferred in a shorter time due to an internal buffer stage which can accommodate heavy loads promptly.

This invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modification of embodiments as fall within the true scope of the invention.

What is claimed is:

1. Apparatus for dividing an input/output line coupled to a sense amplifier which is driven by the status of a bit line pair connected to said sense amplifier, the apparatus comprising:
   a sub-input/output line connected to said bit line pair through corresponding first MOS transistors; and
   a main input/output line connected to output nodes of said sub input/output line through corresponding second MOS transistors.

2. Apparatus according to claim 1 wherein the status of said sub input/output line is changed in response to a first decoding signal applied to said first transistors.

3. Apparatus according to claim 1 wherein the status of said main input/output line is changed in response to a second decoding signal applied to said second transistors subsequent to the application of said first decoding signal to said first transistors.

* * * * *